(12) United States Patent
Takahashi et al.

(10) Patent No.: US 9,735,550 B2
(45) Date of Patent: Aug. 15, 2017

(54) LIGHT SOURCE UNIT, ILLUMINATOR, AND DISPLAY

(75) Inventors: Kazuyuki Takahashi, Kanagawa (JP); Koji Miura, Tokyo (JP); Tatsuya Oiwa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 600 days.

(21) Appl. No.: 13/511,697

(22) PCT Filed: Jul. 22, 2011

(86) PCT No.: PCT/JP2011/066677
§ 371 (c)(1),
(2), (4) Date: Oct. 11, 2012

(87) PCT Pub. No.: WO2012/014798
PCT Pub. Date: Feb. 2, 2012

(65) Prior Publication Data
US 2013/0021581 A1    Jan. 24, 2013

(30) Foreign Application Priority Data

Jul. 30, 2010    (JP) .................................. 2010-172181

(51) Int. Cl.
*G03B 21/14*    (2006.01)
*F21V 9/00*    (2015.01)
(Continued)

(52) U.S. Cl.
CPC ........ *H01S 5/4093* (2013.01); *H01S 5/02292* (2013.01); *H01S 5/02296* (2013.01);
(Continued)

(58) Field of Classification Search
CPC .. H04N 9/3173; H04N 9/3197; H04N 9/3167; H01S 5/40; H01S 5/4093;
(Continued)

(56) References Cited

U.S. PATENT DOCUMENTS 4,992,918 A * 2/1991 Shioiri et al. ................. 362/368
8,036,533 B2 * 10/2011 Hosomi et al. ................ 398/79
(Continued)

FOREIGN PATENT DOCUMENTS

JP    57-023293    2/1982
JP    HEI07-063943    3/1995
(Continued)

OTHER PUBLICATIONS

International Search Report dated Aug. 23, 2011.
(Continued)

*Primary Examiner* — Bao-Luan Le
*Assistant Examiner* — Christopher Lamb, II
(74) *Attorney, Agent, or Firm* — Dentons US LLP

(57) ABSTRACT

An illuminator and a display capable of achieving miniaturization are provided with use of a plurality of light sources emitting light with two or more kinds of wavelengths. In the light source unit 11, a red-color laser 11R, a green-color laser 11G, a blue-color laser 11B, a microlens section 116, and a microprism 117 are integrated on a base material. Each laser beam emitted from each of the laser light sources is transmitted through the microlens section 116, and then, comes into the microprism 117. In the microprism 117, optical path conversion is performed to shorten the distance between the optical paths of the incident light beams (to allow the optical axes of the incident light beams to be closer to each other). Due to the above-described integration, the optical paths of the laser beams are allowed to be synthesized using the microscopic-scaled microlens section and microprisms.

24 Claims, 10 Drawing Sheets

(51) Int. Cl.
*H01S 5/40* (2006.01)
*H01S 5/022* (2006.01)
*H04N 9/31* (2006.01)

(52) U.S. Cl.
CPC ......... *H04N 9/3152* (2013.01); *H04N 9/3161* (2013.01); *H04N 9/3173* (2013.01); *H01L 2224/48091* (2013.01); *H01S 5/02212* (2013.01); *H01S 5/4012* (2013.01)

(58) Field of Classification Search
CPC .... H01S 5/02292; H01S 5/4012; H01S 5/005; H01S 5/0057; H01S 5/0064; H01S 5/0071; H01S 5/0078; H01S 5/0085; H01S 5/0092; H01S 5/02; H01S 5/02288; H01S 5/02296; H01S 3/005; H01S 3/0057; H01S 3/0064; H01S 3/0071; H01S 3/0078; H01S 3/0085; H01S 3/0092; G03B 21/2033; G03B 21/2073; G03B 21/208; G03B 33/06; G02B 27/285
USPC ......... 353/31, 39, 94, 20, 30; 362/231, 509; 372/22; 359/27; 398/79; 369/44.37
See application file for complete search history.

(56) References Cited

U.S. PATENT DOCUMENTS

| | | | | |
|---|---|---|---|---|
| 2001/0050892 | A1* | 12/2001 | Takahashi et al. | 369/112.1 |
| 2004/0213305 | A1* | 10/2004 | Nakae et al. | 372/36 |
| 2004/0252744 | A1* | 12/2004 | Anikitchev | G02B 27/0977 372/100 |
| 2005/0122486 | A1* | 6/2005 | Trollsch | 353/94 |
| 2006/0114423 | A1* | 6/2006 | Maeda | H04N 9/315 353/94 |
| 2007/0273794 | A1* | 11/2007 | Sprague et al. | 348/744 |
| 2008/0068852 | A1* | 3/2008 | Goihl | 362/509 |
| 2009/0213330 | A1* | 8/2009 | Silverstein et al. | 353/8 |
| 2011/0304828 | A1* | 12/2011 | Khechana et al. | 353/20 |

FOREIGN PATENT DOCUMENTS

| | | |
|---|---|---|
| JP | 2001-127376 | 5/2001 |
| JP | 2001-343706 | 12/2001 |
| JP | 2005-100480 | 4/2005 |
| JP | 2005-128349 | 5/2005 |
| JP | 2006-337595 | 12/2006 |
| JP | 2007-058163 | 3/2007 |
| JP | 2007-299905 | 11/2007 |
| JP | 2009-188056 | 8/2009 |
| JP | 2010-078749 | 4/2010 |
| WO | 2007/116935 | 10/2007 |
| WO | 2009/094136 | 7/2009 |

OTHER PUBLICATIONS

Japanese Patent Office Action corresponding to Japanese Serial No. 2012-526467 dated Jun. 30, 2015.

Extended European Search Report corresponding to European Serial No. 11812388.4 dated Dec. 15, 2016.

* cited by examiner

LIGHT SOURCE UNIT, ILLUMINATOR, AND DISPLAY

TECHNICAL FIELD

The present invention is related to a light source unit, an illuminator, and a display suitably used in, for example, a portable projector.

BACKGROUND ART

An optical module, which is one of main components of a projector (projection-type display), is generally composed of an illuminating optical system (illuminator) including a light source and a projecting optical system (projection optical system) including an optical modulation device. In recent years, in the field of such a projector, a small-sized (palm size) and lightweight portable projector called a microprojector has begun to come into wide use. In the past, for this microprojector, an LED (Light Emitting Diode) has been utilized as a light source.

Meanwhile, a laser has recently drawn attention as a new light source. For example, subsequently to the commercialization of a blue-color semiconductor laser and a red-color semiconductor laser with high power outputs, the development of a green-color semiconductor laser has been also progressed to edge closer to a practicable level. In such a background, a projector utilizing a monochromatic laser (semiconductor laser) of three primary colors including red (R), green (G), and blue (B) has been proposed (for example, see PTL 1 and PTL 2). Use of such a monochromatic laser achieves a projector with a wide color reproduction range and a reduced power consumption.

CITATION LIST

Patent Literature

[PTL 1]: Japanese Unexamined Patent Application Publication No. 2009-188056
[PTL 2]: WO 2007/116935

SUMMARY OF THE INVENTION

In the above-described projector, however, because emitted light from each semiconductor laser is used as illuminating light for image display, it is necessary to perform an optical path synthesis (color synthesis) of each color light, resulting in an optical system being in a large-scaled configuration. In concrete terms, the light synthesis needs optical members taking a wide arrangement space, such as a dichroic prism and a dichroic mirror. This has been a factor preventing further miniaturization (weight saving) in a projector.

In view of foregoing, it is an object of the present invention to provide a light source unit, an illuminator, and a display that allow the miniaturization to be achieved using a plurality of light sources emitting light with two or more kinds of wavelengths.

A light source unit of the present invention includes: a plurality of light sources emitting light with two or more kinds of wavelengths; a microlens section including a plurality of microlenses each of which is disposed to oppose each of the light sources; and a microprism performing optical path conversion for each incident light beam incoming from the plurality of light sources via the microlens section to shorten distance between optical paths of the light beams. The plurality of light sources, the microlens section, and the microprism are integrated on a base material.

An illuminator of the present invention includes the light source unit of the above-described present invention.

A display of the present invention includes: the light source unit of the above-described present invention; and a light modulation device modulating light emitted from the light source unit based on an image signal.

It is to be noted that a word "micro" in the microlens and microprism of the present invention means to be microscopic-scaled, and is not limited to any micro-order scale literally, implying milli-order and any other scales as well.

In the light source unit, the illuminator, and the display of the present invention, integration of the plurality of light sources, the microlens section and the microprism on the base material allows each light emitted from the plurality of light sources to come into the microprism after being transmitted through the microlens section. The microprism performs an optical path conversion for each incident light beams to shorten the distance between the optical paths of each light beams (to bring an optical axis of each incident light beams closer to each other), emitting the resultant light.

In the light source unit and the display of the present invention, integration of the plurality of light sources, the microlens section, and the microprism on the base material makes it easy to guide each light emitted from the plurality of the light sources to the same optical path using the microscopic-scaled microlens section and the microprism. In other words, it is possible to synthesize each light emitted from the plurality of light sources in a microscopic region. This allows the miniaturization to be achieved using the plurality of the light sources emitting light with two or more kinds of wavelengths.

DESCRIPTION OF EMBODIMENTS

Hereinafter, the embodiments of the present invention are described in details with reference to the drawings. It is to be noted that the descriptions are provided in the order given below.

1. First embodiment (example of a display using a light source unit that integrates three types (R, G, B) of laser chips in a single package)
2. Second embodiment (example of a display using a light source unit that integrates two types (R, B) of laser chips in a single package)
3. Modification example (example of a light source unit that mounts three types (R, G, B) of laser chips without packaging on a substrate)

First Embodiment

Overall Configuration of Display 1

Figure 1:
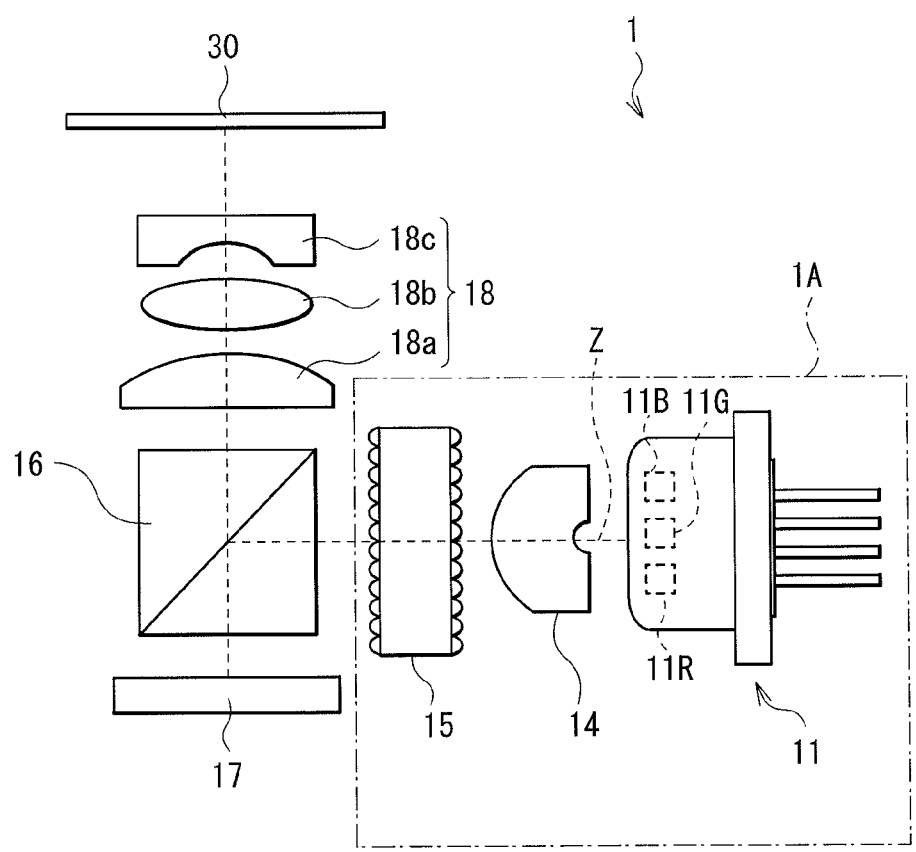
FIG. 1 is a diagram showing an overall configuration of a display according to a first embodiment of the present invention.

FIG. 1 shows an overall configuration of a display (display 1) according to a first embodiment of the present invention. The display 1, which is a projector to project an image (image light) onto a screen 30 (image projected plane), includes an illuminator 1A, and an optical system (display optical system) to perform image display using illumination light from the illuminator 1A.

[Illuminator 1A]

The illuminator 1A has a light source unit 11, an expander lens 14, and a fly-eye lens 15 along an optical axis Z.

The light source unit 11 houses two or more types of light sources emitting light with different wavelengths within a single package (integrates two or more types of light sources in a single package). According to this embodiment, three types of laser light sources of R, G, B (red-color laser 11R, green-color laser 11G, and blue-color laser 11B) are used. Along with the red-color laser 11R, the green-color laser 11G, and the blue-color laser 11B, the light source unit 11 has a microlens section 116, a microprism 117, and a retardation plate 118 (not shown in FIG. 1) to be hereinafter described. Detailed configuration of the light source unit 11 is to be described later.

The expander lens 14 is a lens for magnifying a beam diameter of incident light.

The fly-eye lens 15, on which, for example, a plurality of lenses are two-dimensionally arranged on a substrate, is intended to uniform an in-plane luminance distribution of incident light. In this embodiment, light emitted from the fly-eye lens 15 is utilized as illumination light at the time of image display.

(Display Optical System)

The above-described display optical system includes, for example, a polarization beam splitter (PBS) 16, a reflection-type liquid crystal panel 17 (optical modulation device), and a projection lens 18 (projection optical system).

The polarization beam splitter 16 is an optical member that selectively transmits a specific polarized light (for example, p-polarized light) therethrough, while selectively reflecting the other polarized light (for example, s-polarized light). This allows illumination light (for example, s-polarized light) from the illuminator 1A to be selectively reflected to come into the reflection-type liquid crystal panel 17, and allows image light (for example, p-polarized light) emitted from the reflection-type liquid crystal panel 17 to be selectively transmitted to come into the projection lens 18.

The reflection-type liquid crystal panel 17, which is composed of, for example, an LCOS (Liquid Crystal On Silicon) and the like, emits image light by reflecting while modulating illumination light from the illuminator 1A on the basis of an image signal to be supplied from a display control section that is not shown in the figure. On the reflection-type liquid crystal panel 17, image light is emitted toward the polarization direction different from that at the light incoming time. For example, the polarization direction at the light outgoing time is rotated by 90 degrees (for example, p-polarized light) with respect to the polarization direction at the light incoming time (for example, s-polarized light).

The projection lens 18, which is a lens to perform projection (magnified projection) of image light emitted from the reflection-type liquid crystal panel 17 onto the screen 30, is composed of three pieces of lenses 18a, 18b, and 18c.

[Detailed Configuration of Light Source Unit 11]

Figure 2:
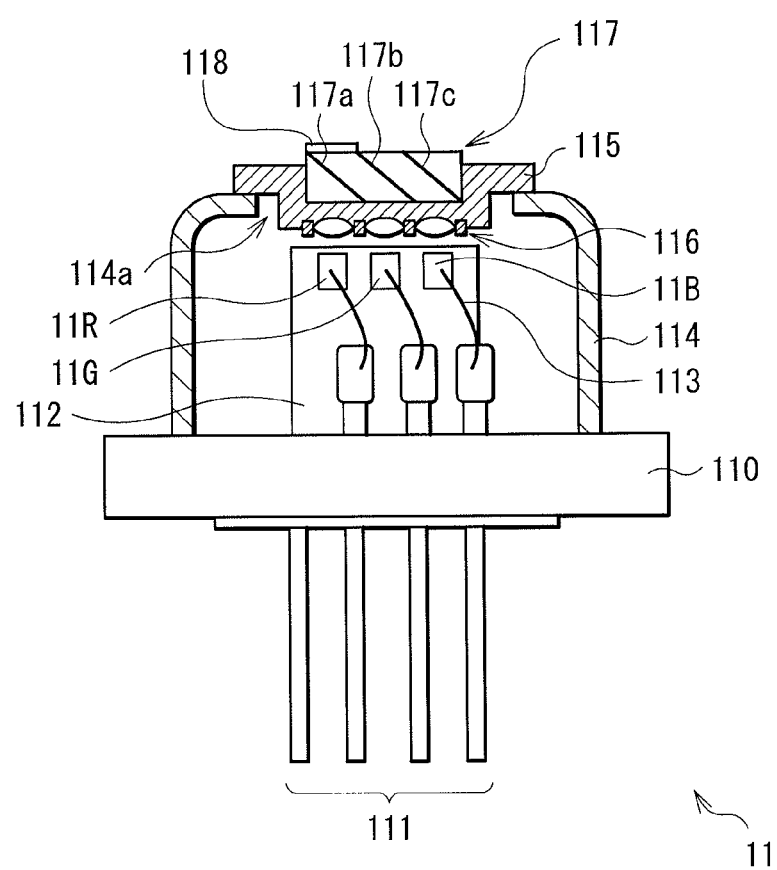
FIG. 2 is a schematic diagram showing a simplified configuration of a light source unit illustrated in FIG. 1.

FIG. 2 schematically shows a structure of the light source unit 11. The light source unit 11 has, for example, a stem 112 that functions as a heat sink and the like for example on a tabular supporting plate 110, and the red-color laser 11R, the green-color laser 11G, and the blue-color laser 11B are mounted respectively on this stem 112. The red-color laser 11R, the green-color laser 11G, and the blue-color laser 11B are disposed on the stem 112 at predetermined pitches in parallel, and allow the major-axis directions of far field patterns (FFP) of outgoing light to match each other. Each laser is connected with a terminal 111 through a bonding wire 113, and the terminal 111 passes through the supporting plate 110 to be pulled out to the outside.

The red-color laser 11R, the green-color laser 11G, and the blue-color laser 11B are sealed with a sealing member 114 (package) provided on the supporting plate 110. In other words, as described above, the red-color laser 11R, the green-color laser 11G, and the blue-color laser 11B are housed in a single package. As a part thereof, the sealing member 114 has a window 114a (opening), toward which each laser beam is emitted. A holder 115 (holding member) is fitted to such a window 114a of the sealing member 114.

Figure 3:
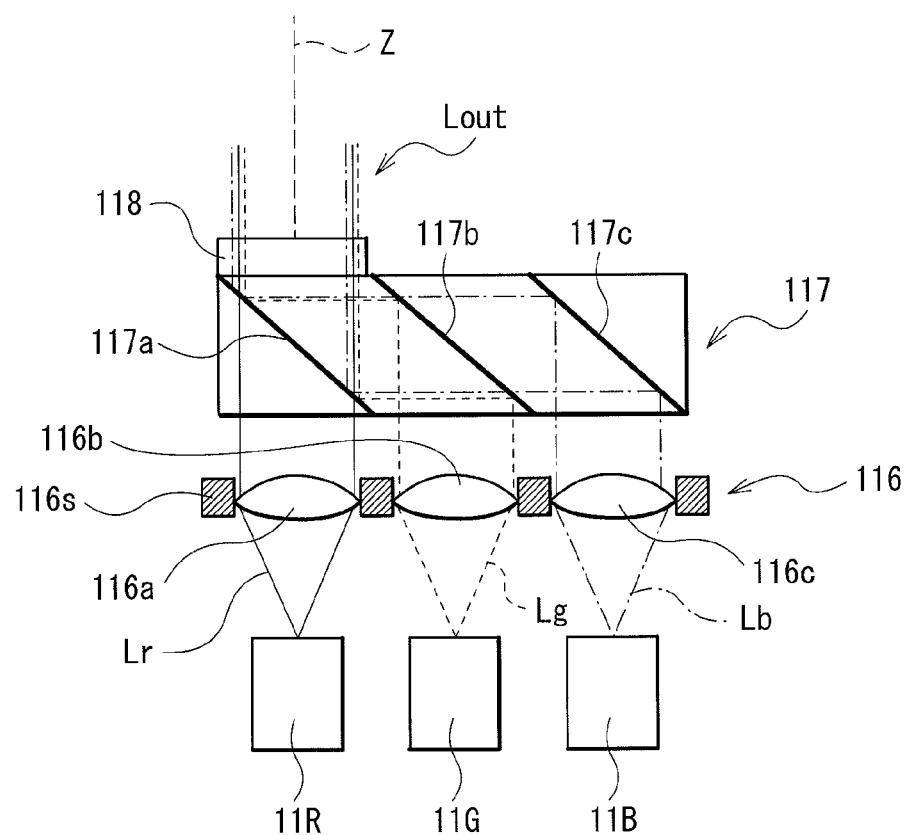
FIG. 3 is a schematic diagram for explaining a detailed configuration and operation of a microlens section and a microprism illustrated in FIG. 1.

In the holder 115, the microlens section 116 and the microprism 117 are held. FIG. 3 magnifies selectively to show optical members in the vicinity of the holder 115 (red-color laser 11R, green-color laser 11G, blue-color laser 11B, microlens section 116, microprism 117, and retardation plate 118 to be hereinafter described). As shown in the figure, this embodiment has a structure that integrates three types of the packaged lasers, and the microscopic-scaled (scaled to be comparable with a package) microlens section 116 and microprism 117 on a substrate (supporting plate 110 in this embodiment).

The microlens section 116 includes a plurality of microlenses with an NA (Numerical Aperture) conversion function, specifically, the same number of such microlenses as the laser light sources (three microlenses 116a to 116c in this embodiment). The microlenses 116a to 116c are disposed to oppose the red-color laser 11R, the green-color laser 11G, and the blue-color laser 11B, respectively, and these microlenses are isolated using a sidewall 116s with a light blocking effect. With these microlenses 116a to 116c, outgoing light from the red-color laser 11R (red-color laser beam Lr), outgoing light from the green-color laser 11G (green-color laser beam Lg), and outgoing light from the blue-color laser 11B (blue-color laser beam Lb) are substantially paralleled.

Diameters of these microlenses 116a to 116c are set at proper values keeping the miniaturization and optical utilization efficiency in mind, and may be in the range from 0.8 to 1.0 mm as an example. Further, it is preferable that a number of apertures for each of the microlenses 116a to 116c be 0.26 or more to assure the geometrical-optical utilization efficiency of 70% or greater for example for a light beam with radiation angle of each wavelength (vertical direction θΨ at 20 to 45 degrees) (to be hereinafter described for details).

The microprism 117 performs optical path conversion for each incident light incoming from the red-color laser 11R, the green-color laser 11G, and the blue-color laser 11B via the microlens section 116 to shorten a distance between optical paths of the light. Ideally, the optical path conversion is carried out to allow the optical paths of the incident light incoming into the microprism 117 approximately match each other after emission of the light. In other words, the microprism 117 corrects an optical axis shift (optical path shift) of each color light that is caused by an arrangement layout of each laser (shift in light-emitting point location of each laser) within the light source unit 11.

The microprism 117, which is composed of, for example, a plurality of joined prisms, has dichroic coating films 117a to 117c (optical function films) on joint surfaces of the prisms. The dichroic coating films 117a to 117c are formed to oppose the microlenses 116a to 116c respectively, having the wavelength selectivity in reflectivity and transmittance thereof (having a function to reflect or transmit light of a selective wavelength). In this embodiment, for example, the dichroic coating film 117a opposing the microlens 116a is formed to reflect green-color light and blue-color light, while to transmit red-color light. Further, the dichroic coating film 117b opposing the microlens 116b is formed to at least reflect green-color light and transmit blue-color light. Additionally, the dichroic coating film 117c opposing the microlens 116c is formed to at least reflect blue-color light. A size of such a microprism 117 is set at a proper value in accordance with, for example, lens diameters and lens spacing intervals of the microlenses 116a to 116c, or the like. The retardation plate 118 is attached on such a microprism 117 (light outgoing side).

The retardation plate 118 has a function to bring two kinds of polarization directions close to each other when light in such two kinds of polarization directions (for example, s-polarized light and p-polarized light) is incident. Ideally, the retardation plate 118 approximately matches these polarization directions to each other. As a specific example of the retardation plate 118, a half-wavelength plate is preferable that has a function to match one polarization direction to the other polarization direction by rotating one polarization direction by 90 degrees. It is to be noted that the specific example is not limited to such a half-wavelength plate, and a quarter-wavelength plate that converts both polarization directions into circularly-polarized light may be also suitable.

As described above, such a retardation plate 118 is provided on the microprism 117, and a part of the surface at the light outgoing side of the microprism 117 is sufficient for placement region thereof. Although the details are hereinafter described, each incident light incoming from the microlens section 116 side is emitted with each optical path synthesized by the microprism 117, and thus the retardation plate 118 have only to be disposed at a selective region corresponding to at least outgoing optical path thereof (optical path on the optical axis Z). It is to be noted that a placement location of the retardation plate 118 is not limited to the light outgoing side of the microprism 117, and the retardation plate 118 may be also disposed at the light incoming side of the microprism 117. In concrete terms, the retardation plate 118 may be disposed between the microprism 117 and the microlens section 116, or between the microlens section 116 and the red-color laser 11R, the green-color laser 11G, or the blue-color laser 11B.

[Operation and Effects of Display 1]
(Display Operation)

In the display 1, in the illuminator 1A, a laser beam emitted from the light source unit 11 comes into the fly-eye lens 15 after a beam diameter thereof is first magnified by the expander lens 14 to be uniformed (in in-plane luminance distribution) through the fly-eye lens 15. As a result, a laser beam as illumination light is emitted from the fly-eye lens 15 (illuminator 1A) toward the display optical system.

The illumination light emitted from the illuminator 1A in such a manner first comes into the polarization beam splitter 16, in which selective polarized light (for example, s-polarized light) is reflected, and thereafter enters the reflection-type liquid crystal panel 17. On the reflection-type liquid crystal panel 17, this incident light is reflected while being modulated on the basis of an image signal, thereby being emitted as image light to the polarization beam splitter 16 side. This image light transmits through the polarization beam splitter 16 because it is emitted with polarization direction thereof rotated by 90 degrees from that of the incoming time (for example, it is converted into p-polarized light). The image light is transmitted through the polarization beam splitter 16 is projected (magnified projection) toward the screen 30 by the projection lens 18.

As described above, the image display is carried out based on a laser beam emitted from the light source unit 11, and the laser beam is configured of synthesized laser beams of three primary colors R, G, and B as described below. In the display 1, this allows for a full-color image display based on each color component of R, G, B.

(Operation in Light Source Unit 11)
(1. R, G, B Optical Path Synthesis)

As shown in FIG. 3, in the light source unit 11, when laser beams of each color (Lr, Lg, and Lb) are first emitted from the red-color laser 11R, the green-color laser 11G, and the blue-color laser 11B, each outgoing light comes into the microlens section 116. More specifically, the red-color laser beam Lr comes into the microlens 116a, and the green-color laser beam Lg comes into the microlens 116b, while the blue-color laser beam Lb comes into the microlens 116c, respectively. Each of the incoming laser beams Lr, Lg, and Lb is substantially paralleled individually in the microlenses 116a to 116c to be emitted toward the microprism 117. In such a manner, each of the laser beams Lr, Lg, and Lb that are emitted from the red-color laser 11R, the green-color laser 11G, and the blue-color laser 11B comes into the microprism 117 via the microlens section 116.

In the microprism 117, for example, the following optical path conversion is carried out for each of the incoming laser beams Lr, Lg, and Lb.

In concrete terms, by the use of the dichroic coating films 117a to 117c formed opposing the microlenses 116a to 116c respectively, optical paths of each color light of the laser beams Lr, Lg, and Lb are synthesized on the optical axis Z of the display 1. More specifically, the red-color laser beam Lr incoming through the microlens 116a is transmitted through the dichroic coating film 117a, and thereafter is transmitted through the microprism 117 while keeping almost the same optical path as that at incoming time to be emitted on the optical axis Z. On the other hand, the green-color laser beam Lg incoming through the microlens 116b is guided to the same optical path as that of the red-color laser beam Lr by being reflected by the dichroic coating film 117b, and then by being further reflected by the dichroic coating film 117a to be emitted from the microprism 117. Further, the blue-color laser beam Lb incoming through the microlens 116c is first reflected by the dichroic coating film 117c, and subsequently is transmitted through the dichroic coating film 117b. Afterward, as with the green-color laser beam Lg, the blue-color laser beam Lb is guided to the same optical path as that of the red-color laser beam Lr by being reflected by the dichroic coating film 117a to be emitted from the microprism 117.

This allows, in the light source unit 11, the laser beams Lr, Lg, and Lb that come into the microprism 117 from optical paths different from each other are synthesized on the optical axis Z (Lout) to be emitted as the above-described illumination light.

Comparative Example 1

Figure 4:
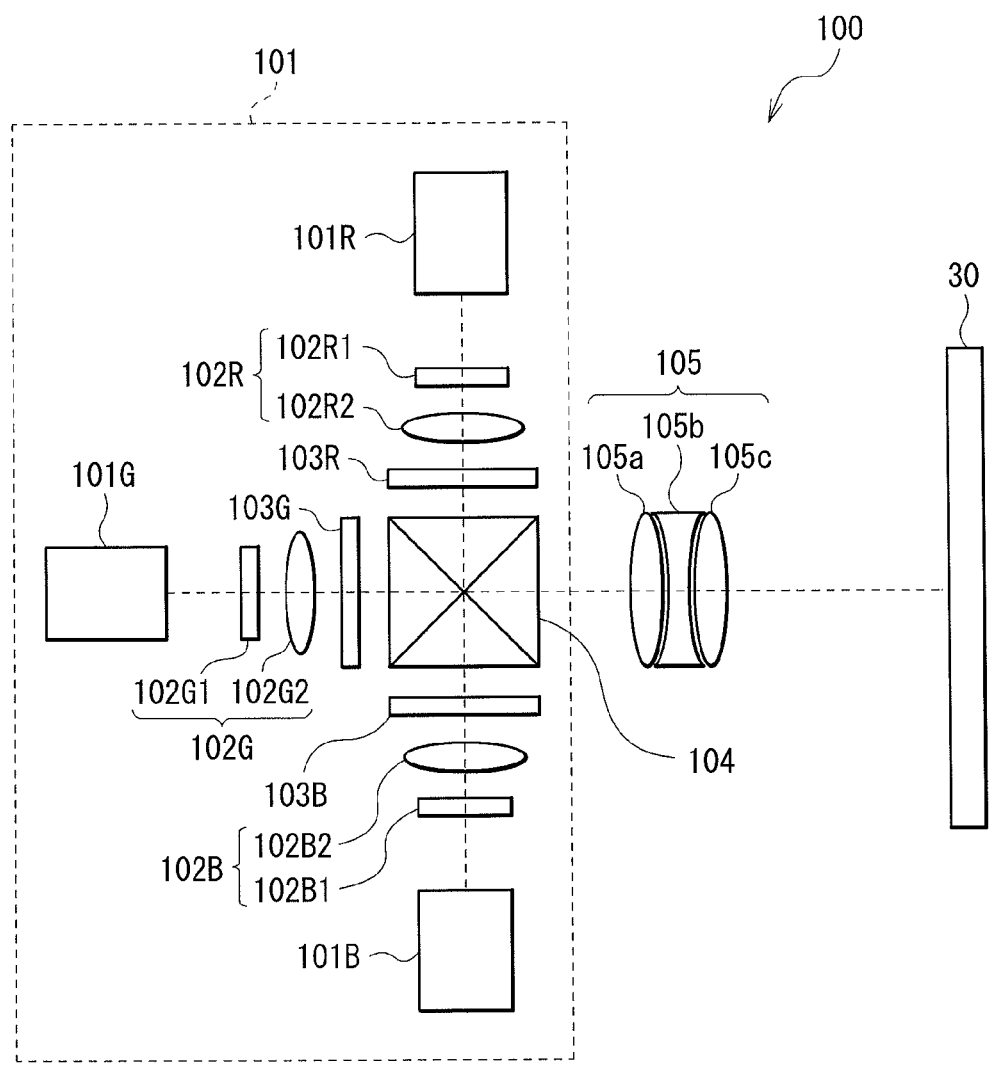
FIG. 4 is a diagram showing an overall configuration of a display according to a comparative example 1.

Here, FIG. 4 shows an overall configuration of a display (display 100) according to a comparative example 1 for this embodiment. As with the above-described display 1, the display 100 according to the comparative example 1, which is a projector to project image light onto a screen 30, includes an illuminator 101 having a red-color laser 101R, a green-color laser 101G, and a blue-color laser 101B, as well as projection lenses 105 (105a, 105b, and 105c) as a display optical system (projection optical system).

The illuminator 101 has uniforming optical systems 102R, 102G, and 102B, as well as optical modulation devices (transmission-type liquid crystal devices) 103R, 103G, and 103B respectively on optical paths of red-color laser beam, green-color laser beam, and blue-color laser beam. The uniforming optical systems 102R, 102G, and 102B are respectively composed of holograms (102R1, 102G1, and 102B1) and field lenses (102R2, 102G2, and 102B2). Further, there is provided a dichroic prism 104 for synthesizing optical paths of the colors.

In the display 100 according to the comparative example 1, in the illuminator 101, light emitted from the red-color laser 101R is transmitted through the uniforming optical system 102R, and subsequently is modulated by the optical modulation device 103R to be emitted out as image light. Similarly, light emitted from the green-color laser 101G is transmitted through the uniforming optical system 102G, and subsequently is modulated by the optical modulation device 103G to be emitted out as image light. Further, light emitted from the blue-color laser 101B is transmitted through the uniforming optical system 102B, and subsequently is modulated by the optical modulation device 103B to be emitted out as image light. The color synthesis (optical path synthesis) for the color image light emitted from the optical modulation devices 103R, 103G, and 103B in such a manner is carried out in a dichroic prism 104.

In such an illuminator 101, however, there are arranged, as the red-color laser 101R, the green-color laser 101G, and the blue-color laser 101B, semiconductor laser packages with each outline dimension of approximately ϕ5.6 mm and a total length of approximately 3.5 mm (excluding a lead section), and the dichroic prism (cross-prism) 104 for the optical path synthesis. Therefore, the size becomes excessively large for an illuminator used for a projector, which makes it difficult to achieve a small-sized projector. Further, to assure the optical utilization efficiency, it is necessary to use the field lenses 102R2, 102G2, and 102B2 that have high NA and have a large outer diameter shape, which is a factor limiting miniaturization.

Comparative Example 2

Figure 5:
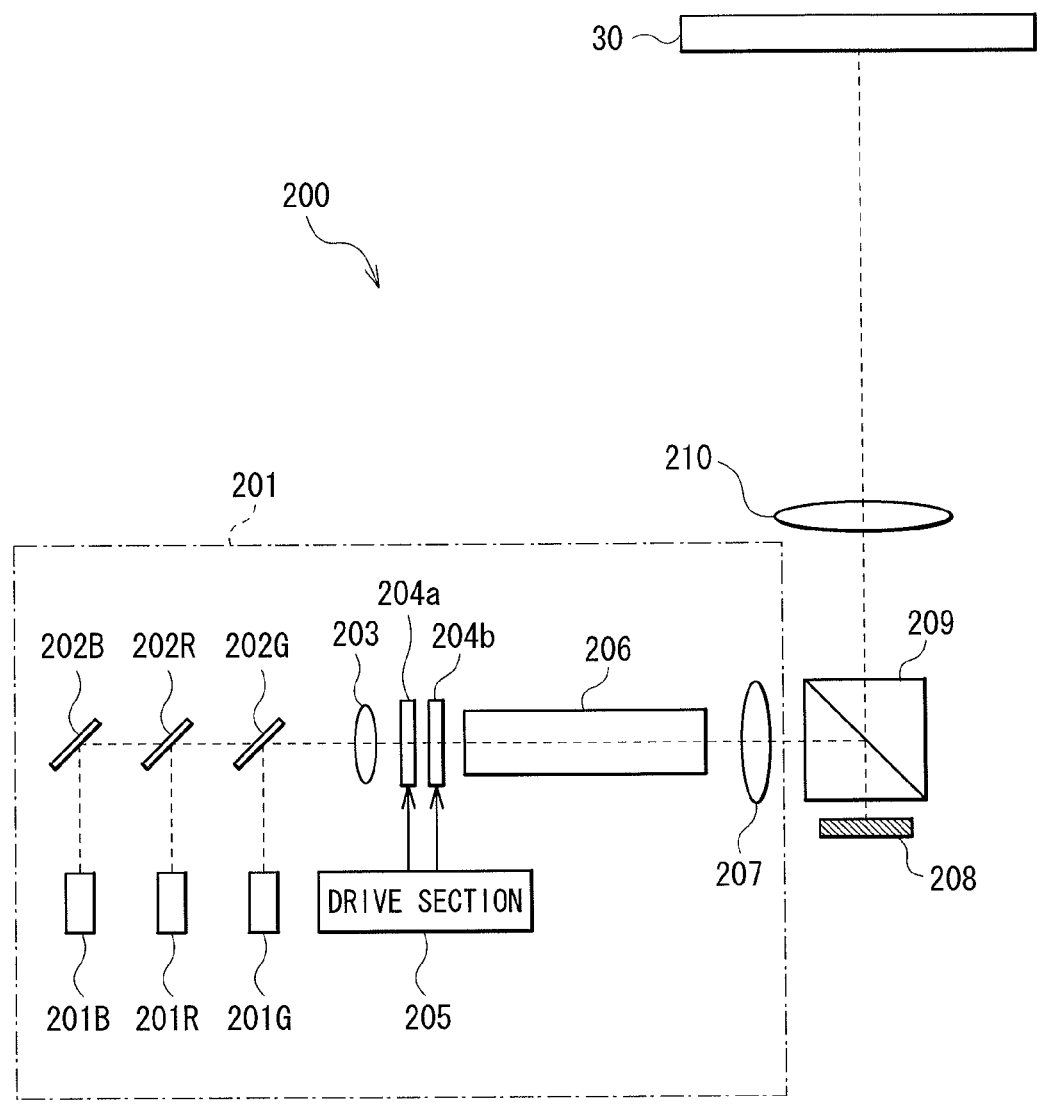
FIG. 5 is a diagram showing an overall configuration of a display according to a comparative example 2.

FIG. 5 shows an overall configuration of a display (display 200) according to a comparative example 2. As with the above-described display 1, the display 200 according to the comparative example 2 is also a projector to project image light onto a screen 30. The display 200 includes an illuminator 201 having a red-color laser 201R, a green-color laser 201G, and a blue-color laser 201B, an optical modulation device (transmission-type liquid crystal device) 208 as a display optical system, a polarization beam splitter 209, and a projection lens 210 (projection optical system).

The illuminator 201 has a mirror 202B, dichroic mirrors 202R and 202G, a condenser lens 203, diffusion devices 204a and 204b, a driving section 205, a rod integrator 206, and a lens 207.

In the display 200 according to the comparative example 2, in the illuminator 201, light emitted from the blue-color laser 201B is reflected by the mirror 202B, and is subsequently transmitted through the dichroic mirrors 202R and 202G selectively to come into the condenser lens 203. Further, light emitted from the red-color laser 201R is selectively reflected by the mirror 202R, and is subsequently transmitted through the dichroic mirror 202G selectively to come into the condenser lens 203. On the other hand, light emitted from the green-color laser 201G is selectively reflected by the dichroic mirror 202G to come into the condenser lens 203. Color laser beams are synthesized in the respective optical paths where respective light comes into the condenser lens 203 by way of the mirror 202B as well as the dichroic mirrors 202R and 202G in such a manner. The color-synthesized light is condensed on an incident end face of the rod integrator 206 by the condenser lens 203. At this time, the diffusion devices 204a and 204b are driven by the driving section 205, and the condensed light is diffused to come into the rod integrator 206. Subsequently, the light uniformed in the rod integrator 206 passes through the lens 207 to be emitted out of the illuminator 201 as illumination light. This illumination light is projected (magnified projection) onto the screen 30 through the polarization beam splitter 209, the optical modulation device 208, and the projection lens 210.

However, as with the above-described comparative example 1, in the illuminator 201 as well, it is necessary to arrange individual semiconductor laser packages corresponding to R, G, and B, a dichroic mirror for the optical path synthesis, and the like. Therefore, the size becomes excessively large for an illuminator used for a projector, which makes it difficult to achieve a small-sized projector.

On the contrary, in this embodiment, as described above, in the light source unit 11, the red-color laser 11R, the green-color laser 11G, and the blue-color laser 11B are housed within a single package (sealing member 114), and the microlens section 116 and the microprism 117 are held by the holder 115 provided on the sealing member 114. That is, the embodiment has a structure that integrates on a substrate three types (R, G, B) of laser chips housed within a microscopic region of the package, as well as the microlens section 116 and the microprism 117 that are microscopic-scaled almost equivalently to the package. This allows that the respective laser beams Lr, Lg, and Lb emitted from the red-color laser 11R, the green-color laser 11G, and the blue-color laser 11B comes into the microprism 117 through the microlens section 116, thereby allowing the optical paths for each of the laser beams Lr, Lg, and Lb to be synthesized on this microprism 117. As a result, in this embodiment, the sizes of the light source unit 11 and the illuminator 1A become suitable especially for a microprojector.

(2. Operation by Microlens Section 116)

Figure 6:
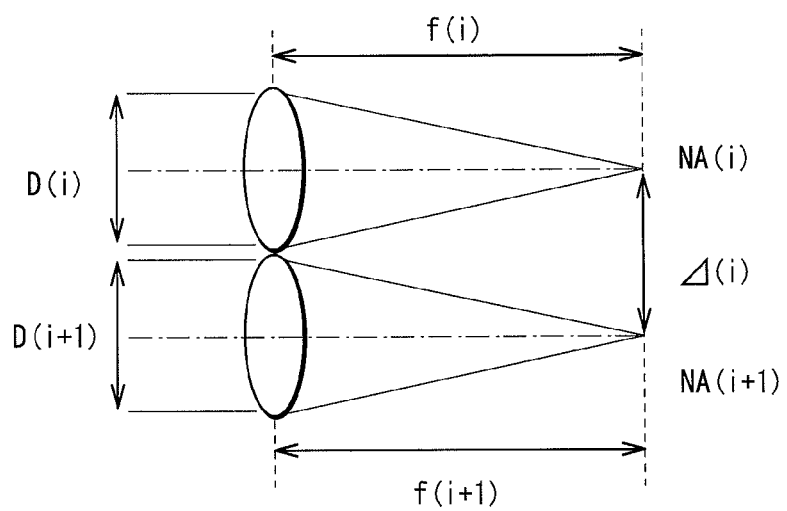
FIG. 6 is a schematic diagram for explaining an operation of the microlens section illustrated in FIG. 1.

Further, in this embodiment, it is desirable that each of the microlenses 116a to 116c satisfy the conditional expression (1) given below in the microlens section 116 arranged in the light source unit 11. Here, FIG. 6 schematically shows two microlenses that are placed adjacently in the closest distance (the i-th and the (i+1)-th microlenses among a plurality of microlenses placed in parallel). In FIG. 6, an effective diameter, the number of apertures, and a focal distance of the i-th microlens are D(i), NA(i), and f(i), respectively, and an effective diameter, the number of apertures, and a focal distance of the (i+1)-th microlens are D(i+1), NA(i+1), and f(i+1), respectively. Further, when i is an integer of 1 or greater, a wavelength of the i-th light source (light source opposing the i-th microlens) is $\lambda(i)$, and a distance between optical axes (distance between light sources (light-emitting points)) of the i-th and the (i+1)-th microlenses is $\Delta(i)$, the following conditional expressions (2) and (3) are to be satisfied.

$$\Delta(i)/(f(i)+f(i+1)) \geq 0.26 \quad (1)$$

$$\lambda(i) > \lambda(i+1) \quad (2)$$

$$f(i) \geq f(i+1) \quad (3)$$

It is possible to derive such a conditional expression (1) in the manner described below. That is, a relationship of the distance between the adjacent light sources (distance between light-emitting points) and the lens (effective diameter) is expressed by the following expression (4), while a relationship of the number of apertures, the focal distance, and the effective diameter in the microlens is expressed by the following expression (5). The expression (6) is derived from these expressions (4) and (5).

$$\Delta(i) \geq (D(i)/2 + D(i+1)/2) \quad (4)$$

$$NA(i) = D(i)/(2 \cdot f(i)) \rightarrow D(i) = 2 \cdot f(i) \cdot NA(i) \quad (5)$$

$$\Delta(i) \geq f(i) \cdot NA(i) + f(i+1) \cdot NA(i+1) \quad (6)$$

When the necessary brightness is made equal between the adjacent microlenses, NA(i)=NA(i+1) is established in the above expression (6) (the number of apertures for the microlenses is NA), and an expression (7) given below is established.

$$\Delta(i)/(f(i)+f(i+1)) \geq NA \quad (7)$$

Meanwhile, in the existing microprojector, a value of 10 (lumen/W) is a reference index of the brightness efficiency. This brightness efficiency is calculated using a predetermined definitional expression from the optical efficiency, electrical efficiency, efficiency of light sources, luminosity factors, and the like. The details of the optical efficiency include the geometric optical efficiency (70%), transmittance of component parts (80%), and efficiency of polarized light (90%), while the details of the electrical efficiency include the aperture ratio (92%) and reflectivity (60%). Further, the luminous efficiency of laser light sources is in the range from about 20 to 25 (W/W) (depending on wavelengths in detail), and a normal constant value is used for the luminosity factor. To achieve the ideal brightness of 10 (lumen/W) from such various viewpoints, it is desirable that the number of apertures for the microlens be 0.26 or more. The above conditional expression (1) is obtained by reflecting this value in the above expression (7).

For example, when three types of laser light sources of R, G, B are used like this embodiment, it is possible to satisfy the conditional expression (1) by applying the following values in the design.

$$\lambda(1)=640 \text{ nm}, \lambda(2)=525 \text{ nm}, \lambda(3)=445 \text{ nm}$$

$$f(1)=1.8 \text{ mm}, f(2)=1.8 \text{ mm}, f(3)=1.8 \text{ mm}$$

$$\Delta(1)=1.0 \text{ mm}, \Delta(2)=1.0 \text{ mm}$$

At this time, a value obtained from the conditional expression (1) becomes 0.277 as indicated below when i=1, 2. Further, in this case, for the microprism 117, it is possible to use a prism with a dimension of 1 mm×1 mm×3 mm, for example.

$$i=1: \Delta(1)/(f(1)+f(2))=0.277$$

$$i=2: \Delta(2)/(f(2)+f(3))=0.277$$

(3. Arrangement of Each Laser Light Source Considering FFP Shape)

Further, in this embodiment, within such a light source unit 11, the following operation is derived by allowing the red-color laser 11R, the green-color laser 11G, and the blue-color laser 11B to be disposed to approximately match the major-axis directions of FFPs of the laser beams Lr, Lg, and Lb to each other.

Figure 7:
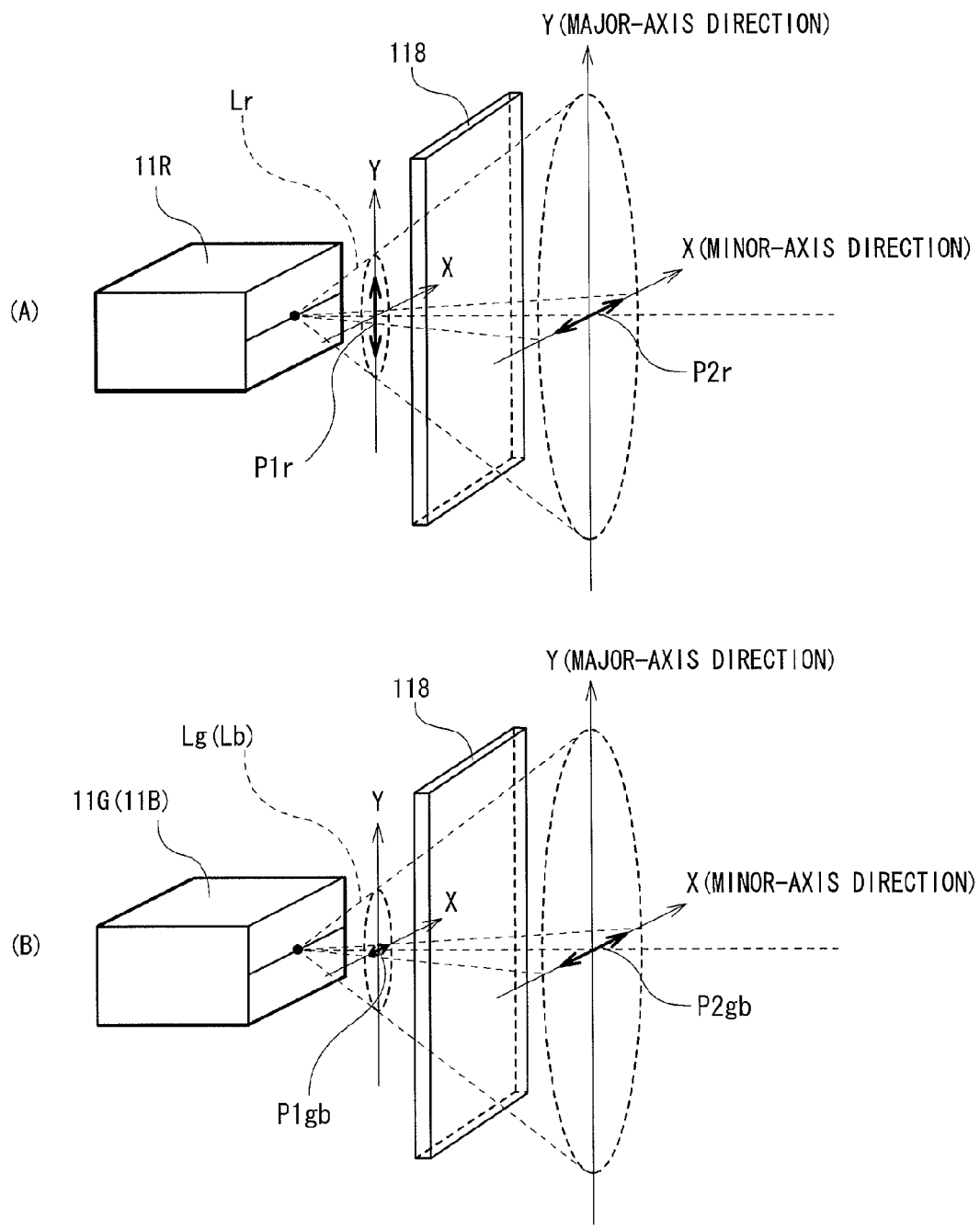
FIG. 7 is a schematic diagram for explaining an operation of a retardation plate illustrated in FIG. 1.

FIG. 7A shows the FFP and polarization direction of the red-color laser beam Lr emitted from the red-color laser 11R, while FIG. 7B shows the FFP and polarization direction of the green-color laser beam Lg (blue-color laser beam Lb is also the same) emitted from the green-color laser 11G (blue-color laser 11B). As shown in the figures, for each of the laser beams Lr, Lg, and Lb that are emitted respectively from the red-color laser 11R, the green-color laser 11G, and the blue-color laser 11B, the FFP takes an elliptical shape having a minor axis in X-direction and a major axis in Y-direction within a XY plane, for example. In other words, major-axis directions in the FFPs of the laser beams Lr, Lg, and Lb match to each other in Y-direction.

This reduces optical loss when an I cut-shaped lens is used, for example. In general, an I cut-shaped lens is often used, for example, when there is a limitation for a thickness of an apparatus, use of such a lens narrows an optical effective range depending on a cutting direction. As described above, by matching the major-axis directions of all the FFPs of the laser beams Lr, Lg, and Lb (that is, shapes of the FFPs) to the I-cutting direction (direction of wider effective diameter), it is possible to reduce any optical loss.

(4. Operation by Retardation Plate 118)

Further, according to this embodiment, in the light source unit 11, the retardation plate 118 is provided on the microprism 117, resulting in the following operation, for example.

As described above, although it is desirable that the major-axis directions of the FFPs of the laser beams Lr, Lg, and Lb (shapes of the FFPs) match each other, polarization directions are different from each other among each of the laser beams Lr, Lg, and Lb at this time. In concrete terms, a polarization direction P1r of the red-color laser beam Lr becomes identical to the major-axis direction (Y-axis direction) of the FFP (FIG. 7(A)). On the other hand, a polarization direction P1gb of the green-color laser beam Lg (blue-color laser beam Lb) becomes identical to the minor-axis direction (X-axis direction) of the FFP (FIG. 7(B)). As described above, although the FFP shapes of laser beams are matched among R, G, B, when polarization directions thereof are different from each other (two kinds of polarization directions are present in this case), the following disadvantage may occur. That is, for example, like this embodiment, when the optical path separation (optical path conversion) is carried out in combination with the reflection-type liquid crystal panel 17 and the polarization beam splitter 16 in the display optical system, it is ideal that polarization directions of the illumination light are matched. Therefore, it is desirable that the polarization directions of the color light in the laser beams emitted from the light source unit 11 match one of the polarization directions.

In this respect, the retardation plate 118 is provided on the microprism 117 to allow the laser beams Lr, Lg, and Lb to be emitted with the above-described polarization directions P1r and P1gb brought close to each other. For example, by using a predetermined half-wavelength plate as the retardation plate 118, for the red-color laser beam Lr, the polarization direction P1r is rotated by 90 degrees, and red-color laser beam Lr is emitted in a polarization direction P2r same as the minor-axis direction (X). On the other hand, because such a half-wavelength plate does not operate for the green-color laser beam Lg and the blue-color laser beam Lb where the polarization direction P1gb originally indicates the minor-axis direction (X-axis direction) of the FFP shape, these laser beams are emitted keeping the same polarization direction (P2gb) as that at incoming time. In such a manner, use of the retardation plate 118 makes it possible to match the polarization directions of the laser beams Lr, Lg, and Lb to each other. This also allows the light source unit 11 to be applicable to the display optical system that carries out the optical path separation using the above-described polarized light.

As described above, in this embodiment of the present invention, the light source unit 11 has a structure that integrates the red-color laser 11R, the green-color laser 11G, and the blue-color laser 11B that are housed within a single package, as well as the microlens section 116 and the microprism 117 that are microscopic-scaled almost equivalently to the package. This allows the optical paths of the laser beams Lr, Lg, and Lb to be synthesized without providing a large-scaled optical system like the above comparative examples 1 and 2. As a result, it is possible to achieve the miniaturization using a plurality of light sources emitting light of two or more kinds of wavelengths.

Second Embodiment

Figure 8:
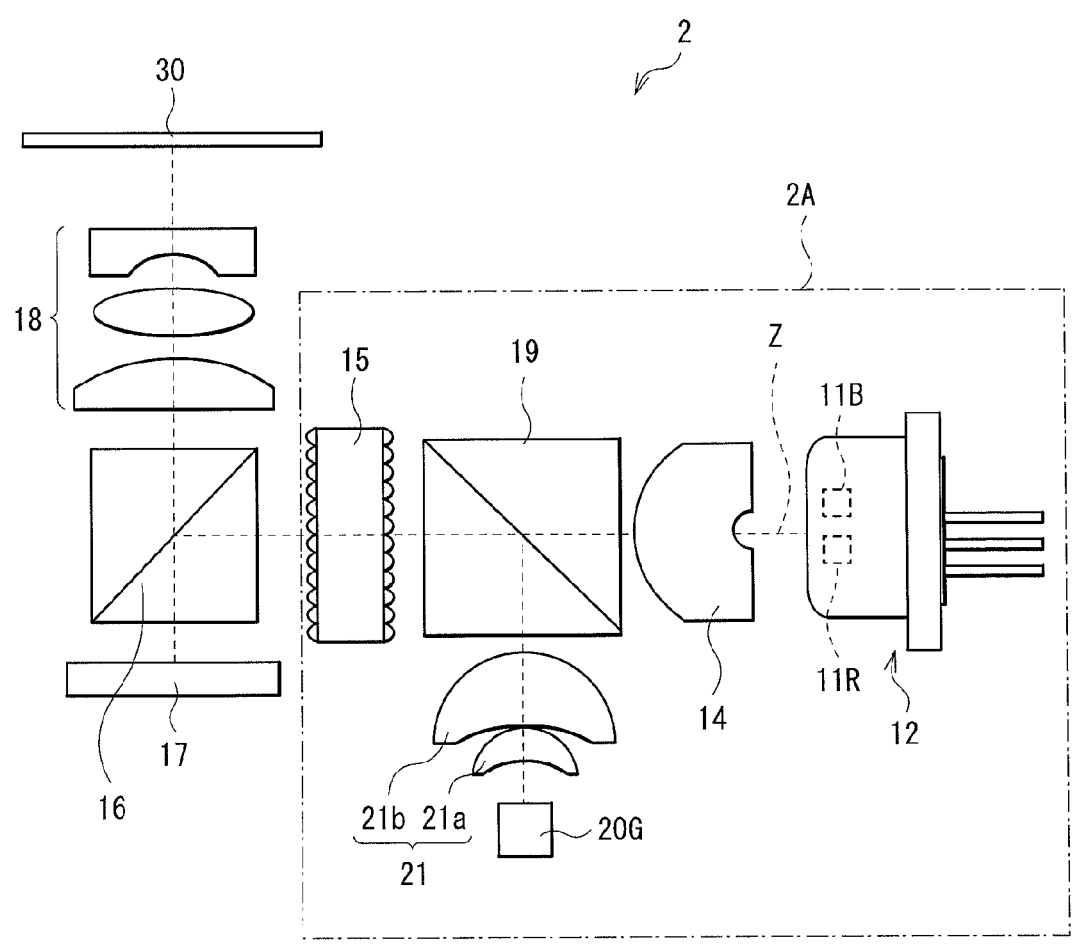
FIG. 8 is a diagram showing an overall configuration of a display according to a second embodiment of the present invention.

FIG. 8 shows an overall configuration of a display (display 2) according to a second embodiment of the present invention. As with the display 1 according to the above-described first embodiment, the display 2 is a projector to project an image onto a screen 30, although a configuration of an illuminator 2A including a light source unit 12 is different from that of the above-described first embodiment. It is to be noted that component parts same as those of the first embodiment are denoted with the same reference numerals, and the related descriptions are omitted as appropriate.

[Configuration of Illuminator 2A]

The illuminator 2A has a light source unit 12, an expander lens 14, a synthesizing prism 19, and a fly-eye lens 15 along the optical axis Z. The illuminator 2A is also provided with a green-color LED 20G opposing the synthesizing prism 19, and coupling lenses 21 (lenses 21a and 21b). That is, in this embodiment, two components of R and B are based on the outgoing light from laser light sources, and G component is based on the outgoing light from the LED.

(Light Source Unit 12)

As with the light source unit 11 according to the above-described first embodiment, the light source unit 12 houses two or more types of light sources within a single package. In this embodiment, however, only two types of laser light sources of R and B (red-color laser 11R and blue-color laser 11B) are housed in a single package.

Figure 9:
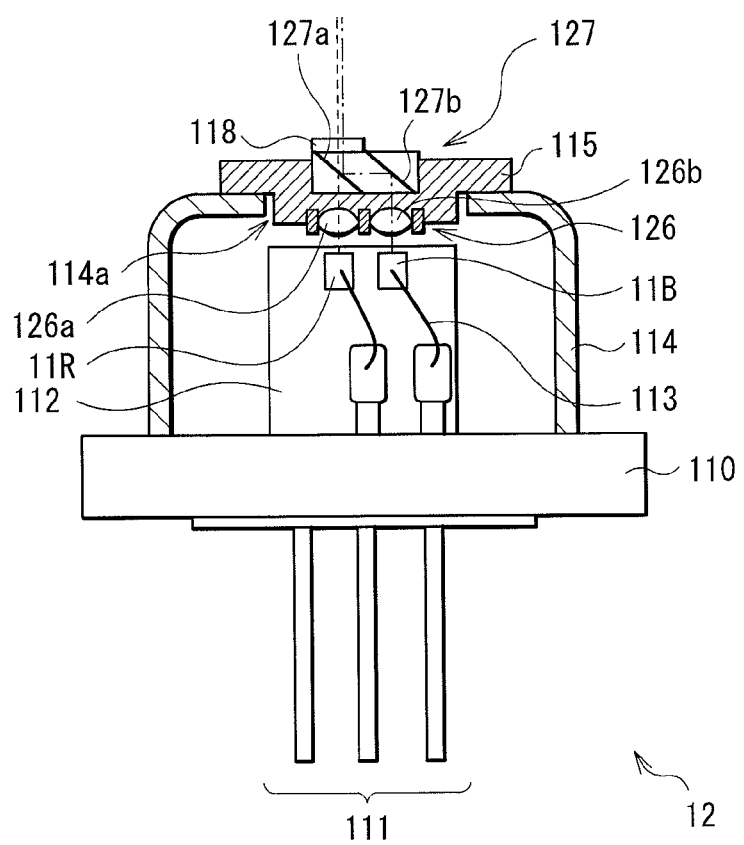
FIG. 9 is a pattern diagram showing a simplified configuration of a light source unit illustrated in FIG. 8.

FIG. 9 schematically shows a structure of the light source unit 12. As with the above-described light source unit 11, the light source unit 12 has, for example, a stem 112 on a supporting plate 110, and the red-color laser 11R and the blue-color laser 11B are mounted respectively on this stem 112. Further, the red-color laser 11R and the blue-color laser 11B are disposed on the stem 112 at a predetermined pitch in parallel, and allow the major-axis directions of FFPs of outgoing light to match each other. Each laser is connected with a terminal 111 for external connection through a bonding wire 113.

These red-color laser 11R and the blue-color laser 11B are sealed with a sealing member 114 on the supporting plate 110, and are housed in a single package. Further, a holder 115 is fitted to a window 114a provided on the sealing member 114, and a microlens section 126 and a microprism 127 are held in this holder 115. That is, this embodiment also has a structure that integrates a package in which two types of lasers of R and B are housed, and the microlens section 126 and the microprism 127 that are microscopic-scaled almost equivalently to the package.

As with the microlens section 116 according to the above-described first embodiment, the microlens section 126 includes the same number of microlenses with the NA conversion function as the laser light sources (two microlenses 126a and 126b in this embodiment). These microlenses 126a and 126b are disposed opposing the red-color laser 11R and the blue-color laser 11B, respectively. With these microlenses 126a and 126b, each of red-color laser beam Lr incoming from the red-color laser 11R and blue-color laser beam Lb incoming from the blue-color laser 11B is substantially paralleled. For diameters, the number of apertures, and the like of the microlenses 126a and 126b, as with the above-described microlens section 116 (116a to 116c), it is desirable to set these keeping the miniaturization and optical utilization efficiency (brightness efficiency) in mind.

As with the microprism 117 according to the above-described first embodiment, the microprism 127 performs optical path conversion for each incident light to shorten a distance between optical paths of the light (ideally to match each of optical paths to each other). Further, the microprism 127, which is composed of a plurality of joined prisms, has dichroic coating films 127a and 127b (optical function films) on joint surfaces of the prisms, respectively. The dichroic coating films 127a and 127b are formed opposing the microlenses 126a and 126b respectively, having the wavelength selectivity in reflectivity and transmittance thereof (having a function to reflect or transmit light of a selective wavelength). In this embodiment, for example, the dichroic coating film 127a opposing the microlens 126a is formed to at least reflect blue-color light and transmit red-color light. On the other hand, the dichroic coating film 127b opposing the microlens 126b is formed to at least reflect blue-color light. A size of such a microprism 127 is set at a proper value in accordance with, for example, lens diameters, lens spacing intervals, and the like of the microlenses 126a and 126b. On a light-emitting optical path (optical axis Z) on this microprism 127 (light outgoing side), as with the above-described first embodiment, a retardation plate 118 is attached.

The synthesizing prism 19 synthesizes a laser beam based on outgoing light from the light source unit 12 (synthesized light of red-color laser beam Lr and blue-color laser beam Lb) and a beam based on light emitted from the green-color LED 20G (green-color LED light) on the optical axis Z. The green-color LED 20G is a light emitting diode to emit green-color light. The coupling lens 21, which is composed of, for example, two pieces of lenses 21a and 21b, substantially parallels the light emitted from the green-color LED 20G.

[Operation and Effects of Illuminator 2A (Display 2)]

In the illuminator 2A, a laser beam emitted from the light source unit 12 comes into the synthesizing prism 19 after a beam diameter thereof is magnified by the expander lens 14. On the other hand, LED light emitted from the green-color LED 20G comes into the synthesizing prism 19 after it is substantially paralleled by the coupling lens 21. When the laser beam and LED light are synthesized in the synthesizing prism 19, the synthesized light is transmitted through a fly-eye lens 15 to be emitted out of the illuminator 2A as illumination light. This illumination light passes through the display optical system (polarization beam splitter 16, reflection-type liquid crystal panel 17, and projection lens 18) to become an image light, being projected onto a screen 30.

As shown in FIG. 9, in the light source unit 12, when the red-color laser beam Lr and the blue-color laser beam Lb are emitted from the red-color laser 11R and the blue-color laser 11B, each outgoing light comes into the microlens section 126. More specifically, the red-color laser beam Lr comes into the microlens 126a, and the blue-color laser beam Lb comes into the microlens 126b, respectively. Each of the incoming laser beams Lr and Lb is substantially paralleled individually in the microlenses 126a and 126b to be emitted toward the microprism 127. In the microprism 127, the predetermined optical path conversion is carried out for each of the incoming laser beams Lr and Lb. In concrete terms, by the use of the dichroic coating films 127a and 127b, optical paths of color light of the laser beams Lr and Lb are synthesized on the optical axis Z of the display 1. More specifically, the red-color laser beam Lr incoming through the microlens 126a is transmitted through the dichroic coating film 127a, and thereafter is transmitted through the microprism 127 while keeping almost the same optical path as that at incoming time to be emitted on the optical axis Z. On the other hand, the blue-color laser beam Lb incoming through the microlens 126b is first reflected by the dichroic coating film 127b. Afterward, this is guided to the same optical path as that of the red-color laser beam Lr by being reflected by the dichroic coating film 127a to be emitted from the microprism 127.

This allows that, in the light source unit 12, the laser beams Lr and Lb that come into the microprism 127 from optical paths different from each other to be synthesized on the optical axis Z to be emitted. The red-color laser beam Lr and the blue-color laser beam Lb that are synthesized in such a manner are synthesized with the green-color LED light in the synthesizing prism 19. As a result, the outgoing light from the illuminator 2A finally becomes the light having a component of three primary colors of R, G, and B.

Further, in this embodiment as well, it is desirable that each of the microlenses 126a and 126b in the microlens section 126 satisfy the above conditional expression (1). For example, when two types of laser light sources of R and B are used like this embodiment, it is possible to satisfy the conditional expression (1) by applying the following values in the design.

$\lambda(1)=640$ nm, $\lambda(2)=445$ nm $f(1)=1.35$ mm, $f(2)=1.35$ mm $\Delta(1)=0.8$ mm At this time, a value obtained from the conditional expression (1) becomes 0.296 as indicated below when i=1. Further, in this case, for the microprism 127, it is possible to use a prism with a dimension of 0.8 mm×0.8 mm×1.6 mm, for example.

$i=1: \Delta(1)/(f(1)+f(2))=0.296$

Further, in this embodiment as well, the red-color laser 11R and the blue-color laser 11B are disposed to approximately match the major-axis directions of FFPs of the laser beams Lr and Lb to each other, thereby allowing to reduce optical loss, as with the above-described first embodiment.

In addition, because the retardation plate 118 is provided on the microprism 127, polarization directions after emission from the light sources of the red-color laser beam Lr and the blue-color laser beam Lb are different from each other, which makes it possible to approximately match these polarization directions to each other.

Therefore, as with the above-described first embodiment, in the display 2, it is possible to achieve full-color image display. Further, integration of two types of laser light sources of R and B that are housed in a single package, and the microlens section 126 and the microprism 127 allows to achieve the light source unit 12 (illuminator 2A) with a size suitable for a microprojector. As a result, it is possible to obtain the effects equivalent to the above-described first embodiment.

Modification Example

Subsequently, the description is provided on a modification example for the present invention. Although this modification example is applicable to both the first and second embodiments, the description is provided by taking a case of using three types of laser chips that is described in the first embodiment as an example. Hereinafter, component parts same as those of the first embodiment are denoted with the same reference numerals, and the related descriptions are omitted as appropriate.

Figure 10:
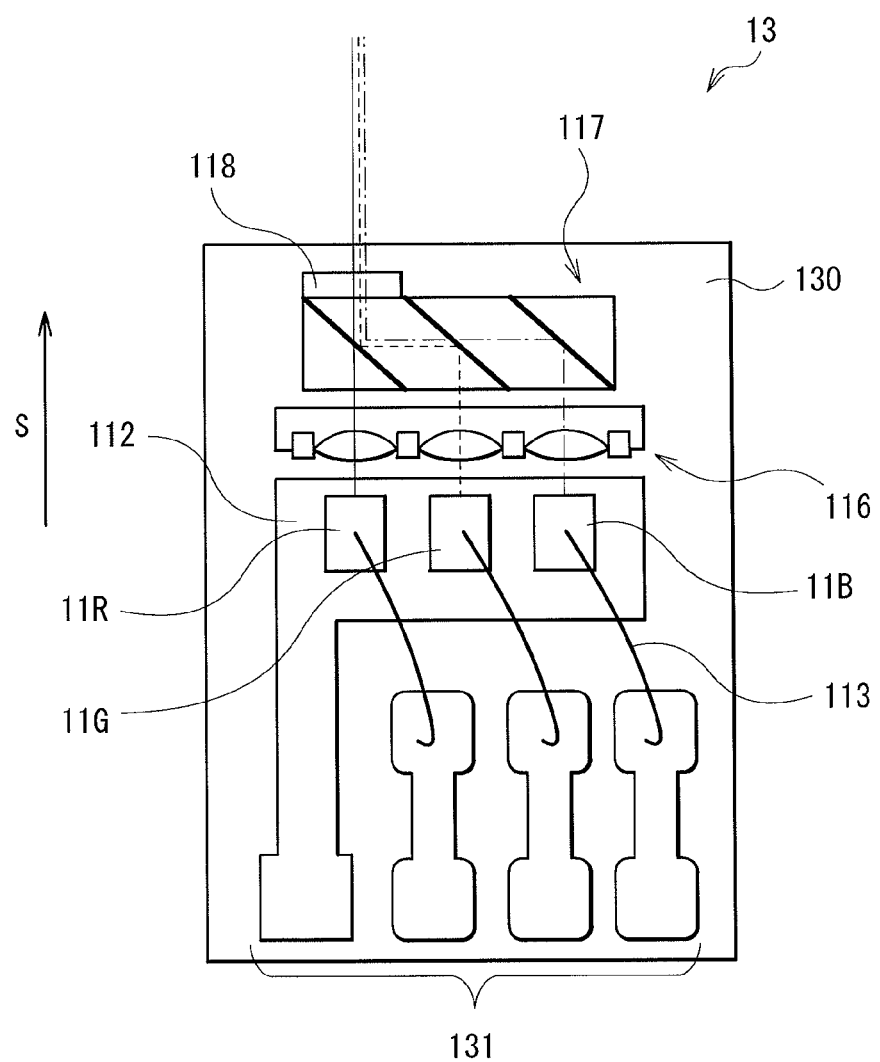
FIG. 10 is a schematic diagram showing a simplified configuration of a light source unit according to a modification example.

FIG. 10 shows a simplified configuration of a light source unit according to a modification example (light source unit 13). As with the light source unit 11 according to the above-described first embodiment, the light source unit 13 according to this modification example integrates (laminates) on a supporting plate 130 three types of laser light sources (red-color laser 11R, green-color laser 11G, and blue-color laser 11B), and a microlens section 116 and a microprism 117.

In concrete terms, as with the above-described light source unit 11, the light source unit 13 has, for example, a stem 112 on the supporting plate 130, and the red-color laser 11R, the green-color laser 11G, and the blue-color laser 11B are mounted respectively on this stem 112. Further, the red-color laser 11R, the green-color laser 11G, and the blue-color laser 11B are disposed on the stem 112 at a predetermined pitch in parallel, and to allow the major-axis directions of FFPs of outgoing light to match each other. Each laser is connected with a terminal 131 for external connection through a bonding wire 113. Further, at the light outgoing side of the red-color laser 11R, the green-color laser 11G, and the blue-color laser 11B, there are provided the microlens section 116 and the microprism 117.

In this modification example, however, unlike the first embodiment of the present invention, along an in-plane direction S of the supporting plate 130, three types of laser light sources (red-color laser 11R, green-color laser 11G, and blue-color laser 11B), the microlens section 116, and the microprism 117 are laminated. In concrete terms, the present modification example has a laminated structure in which the stem 112 where the red-color laser 11R, the green-color laser 11G, and the blue-color laser 11B are mounted on a surface thereof, the microlens section 116, and the microprism 117 are attached on one principal surface of the supporting plate 130. Further, at the light outgoing side of the microprism 117, the retardation plate 118 is attached like the first embodiment. That is, unlike the above-described first and second embodiments, this modification example has a structure where each light source is not packaged, but is mounted together with the microlens section 116 and the microprism 117 on a substrate.

Like this modification example, the red-color laser 11R, the green-color laser 11G, and the blue-color laser 11B do not have to be housed in a single package. A structure to integrate these lasers together with the microlens section and the microprism at a microscopic region on the same substrate allows the effects equivalent to those of the first embodiment to be obtained.

Although the present invention is described hereto by citing the embodiments and the modification example, the present invention is not limited to those embodiments and the like, and a variety of modifications are allowed to be made. For example, in the above-described embodiments and the like, the description is provided on a case where a plurality of light sources within the light source unit are all laser light sources, however, light sources are not limited thereto, and other light sources (such as LED) may be included, or laser light source and LED may be mounted in combination. Further, the number, placement (arrangement order), and the like of each laser light source are also not limited to those described above.

Further, in the above-described second embodiment of the present invention, the red-color laser and the blue-color laser are provided within the light source unit 12, while the green-color LED is provided outside the light source unit, and thereby, the synthesized light of R and B laser beams and LED light of G is used as the illumination light, however, a combination of laser wavelength and LED wavelength is not limited thereto.

Moreover, in the above-described embodiments and the like, the reflection-type liquid crystal panel is taken as an example for the optical modulation device, however, the optical modulation device is not limited thereto, and, for example, a transmission-type liquid crystal panel, a DMD (Digital Micromirror Device), and the like may be used alternatively.

In addition, in the above-described embodiments and the like, the description is provided by specifically citing each component part (optical system) of the illuminator and the display, however, it may not be necessary to provide all these component parts, and other component parts may be further provided.

Further, in the above-described embodiments and the like, a projector (especially a microprojector) is taken as an example for the display of the present invention, however, the display is not limited thereto, and it is also applicable to a direct-view-type display or a photolithography machine such as a stepper, for example.

The invention claimed is:

1. A light source unit comprising:
a supporting plate;
a stem supported on the supporting plate;
a sealing member supported on the supporting plate and enclosing the stem, the sealing member having an opening;
a holder in the opening;
a plurality of semiconductor laser chip light sources supported on the stem, each laser light chip to emit a respective laser light beam with polarized light, the laser chip light sources positioned in parallel and at a pitch such that major-axis directions of far field patterns (FFPs) of their outgoing light match;
a microlens section including a plurality of microlenses each of which is associated with a respective one of the light sources, the microlens supported on the holder;
a microprism with a plurality of dichroic structures each of which is associated with a respective one of the light sources, the microprism supported on the holder; and
a retardation plate that brings first and second polarization directions of light beams to be closer to each other, the first and second polarization directions being different from each other,
wherein,
the retardation plate is attached to the microprism,
except for a last dichroic structure each dichroic structure reflects light emitted by its associated light source, and
the last dichroic structure is transmissive with respect to light emitted by its associated light source but reflective with respect to light emitted by other light sources.

2. The light source unit according to claim 1, wherein the microprism performs optical path conversion on the light beams from the light sources to approximately match the optical paths of the light beams.

3. The light source unit according to claim 1, wherein the dichroic structures are arranged in series from a first dichroic structure to the last dichroic structure, the first dichroic structure reflecting light of a first color, the last dichroic structure transmitting light of last color but reflecting light of other than the last color, the light of other than the last color being light from light sources not associated with the last dichroic structure.

4. The light source unit of claim 3, wherein:
the light beams are emitted from the light sources in a first direction,
except for the last dichroic structure, the light beams are reflected by the dichroic structures along a second direction orthogonal to the first direction, and
the last dichroic structure transmits the light beam from its associated light source in the first direction and redirects light reflected by the other dichroic structures from the second direction to the first direction.

5. The light source unit according to claim 1, wherein the plurality of light sources include two or more lasers selected from the group consisting of a red-color laser, a green-color laser, and a blue-color laser.

6. The light source unit according to claim 5, wherein the plurality of light sources are a red-color laser, a green-color laser, and a blue-color laser.

7. The light source unit according to claim 5 wherein the retardation plate allows the first and second polarization directions to approximately match each other.

8. The light source unit according to claim 1, wherein the microlens section is supported on a side of the holder facing the laser chips and the microprism is supported on a side of the holder facing away from the laser chips.

9. The light source unit according to claim 1, wherein:
the first polarization direction is the same as the major-axis direction of the FFPs, while the second polarization direction is the same as a minor-axis direction of the FFPs; and
the retardation plate is a half-wavelength plate allowing the first and second polarization directions to approximately match each other by selectively rotating the first polarization direction by 90 degrees.

10. The light source unit of claim 1, wherein each dichroic structure includes a dichroic film.

11. The light source unit of claim 1, wherein the microprism comprises a plurality of prisms joined together in series with joints between them, each dichroic structure comprising a joint and a dichroic film, each joint comprising a surface angled with respect to the light source associated with the dichroic structure, the dichroic film being on the joint surface.

12. The light source unit of claim 1, wherein the retardation plate is on an light incident side of the microprism.

13. The light source unit of claim 1, wherein the retardation plate is on a light emitting side of the microprism.

14. The light source unit of claim 1, wherein the plurality of light sources, the microlens section, the microprism and retardation plate are positioned on a single supporting plate.

15. The light source unit of claim 1, wherein the retardation plate is attached to a light outgoing side of the microprism.

16. The light source unit of claim 1, wherein the retardation plate is attached to a light incoming side of the microprism.

17. A light source unit comprising:
a supporting plate;
a stem supported on the supporting plate;
a plurality of semiconductor laser chip light sources supported on the stem, each laser light chip to emit a respective laser light beam with polarized light, the laser chip light sources positioned in parallel and at a pitch such that major-axis directions of the far field patterns (FFPs) of their outgoing light match;
a microlens section including a plurality of microlenses each of which is associated with a respective one of the light sources, the microlens supported on the supporting plate;
a microprism with a plurality of dichroic structures each of which is associated with a respective one of the light sources, the microprism supported on the supporting plate; and
a retardation plate that brings first and second polarization directions of light beams to be closer to each other, the first and second polarization directions being different from each other,
wherein,
the stem with the plurality of laser chip light sources, the microlens section, and the microprism are laminated on a same planar surface of the supporting plate,
the retardation plate is attached to the microprism,
except for a last dichroic structure each dichroic structure reflects light emitted by its associated light source, and
the last dichroic structure is transmissive with respect to light emitted by its associated light source but reflective with respect to light emitted by other light sources.

18. An illuminator including the light source unit of claim 1 or claim 17.

19. The illuminator of claim 18, wherein the retardation plate is attached to a light outgoing side of the microprism.

20. The illuminator of claim 18, wherein the retardation plate is attached to a light incoming side of the microprism.

21. A display comprising:
the light source unit of claim 1 or claim 17; and
a light modulation device modulating light emitted from the light source unit based on an image signal.

22. The display according to claim 21, further comprising a projection optical system projecting light modulated by the optical modulation device onto a surface.

23. The display of claim 21, wherein the retardation plate is attached to a light outgoing side of the microprism.

24. The display of claim 21, wherein the retardation plate is attached to a light incoming side of the microprism.

* * * * *